United States Patent [19]
Tiemeijer

[11] Patent Number: 6,046,842
[45] Date of Patent: Apr. 4, 2000

[54] OPTOELECTRONIC DEVICE WITH A SEMICONDUCTOR DIODE LASER AMPLIFIER

[75] Inventor: Lukas F. Tiemeijer, Eindhoven, Netherlands

[73] Assignee: JDS Uniphase, San Jose, Calif.

[21] Appl. No.: 09/028,431

[22] Filed: Feb. 24, 1998

[30] Foreign Application Priority Data

Feb. 24, 1997 [EP] European Pat. Off. .............. 97200510

[51] Int. Cl.⁷ .............................. H01S 03/00; G02B 6/32
[52] U.S. Cl. .............................................. 359/344; 385/33
[58] Field of Search ..................................... 359/344, 338; 385/33, 35

[56] References Cited

U.S. PATENT DOCUMENTS

| | | | |
|---|---|---|---|
| 4,941,738 | 7/1990 | Olsson | 350/377 |
| 5,089,786 | 2/1992 | Tamura | 359/333 |
| 5,396,365 | 3/1995 | Gustavsson | 359/337 |
| 5,712,940 | 1/1998 | Van Roemburg et al. | 385/93 |

OTHER PUBLICATIONS

"Polarization–Independent Configuration Optical Amplifier" By N.A. Olsson, Electronic Letters, Aug. 18, 1998, vol. 24, No. 17, pp. 1075–1076.

*Primary Examiner*—Mark Hellner
*Attorney, Agent, or Firm*—Michael A. Glenn

[57] ABSTRACT

The invention relates to an optoelectronic device (1) with a laser amplifier (3) at one side of which are present in the radiation path in that order: a lens (8), a polarization-changing element (17), and a mirror (9) which together with the element (17) forms an orthogonal reflector. Both the radiation to be amplified and the amplified radiation issue from the device at the other side of the amplifier (3). Such a device (1) has a very low sensitivity to the polarization of the radiation to be amplified and is particularly suitable for use at very high bit rates.

A disadvantage of the known device is that its efficiency is not particularly high and not well reproducible.

According to the invention, the lens (8) comprises a magnifying lens (8), and the mirror (9) is present substantially in the image plane of the magnifying lens (8). As a result, the alignment of the amplifier (3) with respect to the lens (8) is much less critical, so that the efficiency is higher and more reproducible. The device is thus not only more suitable for the application mentioned above, but can also be manufactured in a comparatively simple manner. The positioning of the mirror (9) can be used on the one hand for correcting any inaccuracy in the alignment of the amplifier (3) with respect to the magnifying lens (8). Positioning of the mirror (9) is in addition simple, because it is limited to the direction of the radiation path. The angle enclosed by the mirror (9) and the radiation path has substantially no influence on the performance. Preferably, the amplifier (3) itself is already substantially insensitive to polarization. The device (1) according to the invention can thus have a particularly low polarization sensitivity.

10 Claims, 2 Drawing Sheets

OPTOELECTRONIC DEVICE WITH A SEMICONDUCTOR DIODE LASER AMPLIFIER

BACKGROUND OF THE INVENTION

The invention relates to an optoelectronic device comprising a semiconductor diode laser amplifier, often referred to as amplifier for short hereinafter, with a strip-shaped active region which is bounded in longitudinal direction by two end faces where radiation can enter or leave the amplifier, while at one side of the amplifier are present in that order: a lens, a polarization-changing element, and a mirror, such that radiation passing through said element, reflected by the mirror, and passing through the element once more has a polarization which has been rotated through 90°. In general, an amplifier will have a gain factor which is greater than or equal to one. It is noted, however, that a gain factor smaller than or equal to one is also possible, indeed useful under certain circumstances, during operation. It is also possible for the gain factor to be varied in time, such as is the case, for example, when the amplifier is used as a modulator.

Such a device is used, for example, in an optical glass fiber communication system. The device is particularly suitable for use in the wavelength bands around 1.3 $\mu$m and 1.5 $\mu$m.

Such a device is known from the article "Polarization-independent configuration optical amplifier" by N. A. Olsson, published in Electronics Letters, 18th August 1988, vol. 24, No. 17, pp. 1075–1076. The device shown therein (see FIG. 1) comprises a semiconductor diode laser amplifier with two end faces where radiation can enter or leave the amplifier. The radiation to be amplified enters the amplifier at one side thereof, and the radiation leaves the amplifier at the other side after being amplified a first time, subsequently passes through a collimating lens and a Faraday rotator which rotates the polarization through 45°. The radiation is subsequently reflected by a mirror, whereupon it follows the above path in reverse order, during which the polarization is once more rotated through 45° upon passing the Faraday rotator. The radiation finally leaves the amplifier, after a second amplification, at the same side where the radiation to be amplified entered the, amplifier. The radiation to be amplified accordingly passes twice through the amplifier, while the polarization of the radiation passing through the amplifier for the second time has been rotated through 90° compared with the polarization of the first passage. A polarization sensitivity, which is always present in the amplifier and which means that the gain is dependent on the polarization, is neutralized thereby. This means that the final gain achieved no longer depends on the polarization of the radiation to be amplified. In other words, the amplifier is polarization-insensitive in the given configuration. This is of major importance in a number of applications, such as wavelength multiplexing, or more in general applications where it is not possible to keep the gain constant by means of an (opto)electronic feedback control mechanism because of the necessary very high switching speeds.

A disadvantage of the known device is that it has a comparatively low efficiency in practice. This means that the amplifier must be operated at a comparatively high gain factor, which involves several further disadvantages. It is also found that the efficiency varies from one device to another.

SUMMARY OF THE INVENTION

It is an object of the invention to provide a device of the kind mentioned in the opening paragraph which is not subject to the above disadvantages, or at least to a much lesser degree, and which accordingly has a high and stable efficiency. Another object is to obtain such a—still comparatively complicated—device which is easy to manufacture.

According to the invention, a device of the kind mentioned in the opening paragraph is for this purpose characterized in that the lens comprises a magnifying lens, and the mirror is in the image plane of the magnifying lens. The invention is based first of all on the recognition that the low and variable efficiency of the known device results from the fact that the alignment of the amplifier with respect to the collimating lens is critical. Especially the alignment tolerance in the radial or xy direction is determined in that case by the value of the focal distance of the lens, which means that this tolerance is approximately ±1 $\mu$m. This renders it particularly difficult to realize an accurate and reproducible alignment between the amplifier and the lens. The invention is also based on the recognition that said tolerance is dependent on the object field of the lens in the case of a magnifying lens, and is accordingly much greater, for example approximately ±30 $\mu$m. The angle enclosed by the mirror and the optical axis is required to be approximately 90°, not exactly 90°, which is an important advantage of the invention. Neither need said angle be exactly the same for each and every device. Since the mirror is in the image plane of the magnifying lens, any inaccuracy of the alignment of the amplifier with respect to the lens can be corrected afterwards in that the position of the mirror is adjusted. This positioning can take place comparatively easily in that exclusively the position in axial direction is changed. In addition, this can take place in a late stage in the manufacture of the device according to the invention. The use of a magnifying lens, with the mirror present in the image plane thereof, offers additional advantages. Thus it is not necessary in a device according to the invention to place the polarization-changing element at an angle relative to the optical axis in order to prevent adverse effects of reflections at this element. Such a placement is indeed necessary for achieving the envisaged aim in the known device. This further simplifies the manufacture of a device according to the invention. An important advantage of a device according to the invention is that the mirror forming part of the device is subject to less stringent requirements, especially as regards the planeness of the mirror.

In a preferred embodiment of a device according to the invention, the lens comprises an aspherical lens, and an end face of the amplifier lies in the object plane of the lens. The device can be comparatively compact in this manner. The known device, it is true, can be made more compact because the mirror can be placed immediately behind the collimating lens. The device according to the invention, however, can also be sufficiently compact for many applications, given a suitable choice of the properties of the magnifying lens. To achieve a construction which is as compact as possible, preferably, the object distance of the lens is chosen to lie between 0.3 and 3 mm, and the image distance between 3 and 20 mm, preferably between 4 and 10 mm. The magnifying lens then preferably has a magnification factor which is not above approximately 10×, and which is preferably approximately 6×. The total length of the path followed by the radiation after leaving the amplifier up to its return into the amplifier then is, for example, 5 to 12 mm. This path corresponds to an optical travel time of approximately 80 ps, a value which is no longer a limiting factor in practice. This image distance range also allows of a placement of a miniature Faraday rotator, for example having a length of 2 mm and a diameter of 2.5 mm, between the magnifying lens and the mirror. A ¼ λ plate may alternatively be used to advantage as the polarization-changing element. In that case linearly polarized radiation is circularly polarized after passing through the element. After reflection by the mirror, its rotational direction has been changed, and linearly polarized radiation is obtained again after a renewed passage through the element, but this time having a polarization rotated through 90°. The polarization-changing element together with the mirror forms as it were an orthogonal reflector. Preferably, means for separating the entering and returning radiation are present at that side of the amplifier where the radiation to be amplified enters the amplifier. Said means may comprise a 3 dB coupler or alternatively an optical circulator.

In a very attractive modification, the device comprises an optoelectronic module comprising a holder for the amplifier which is provided at one side of the amplifier with a plate which has an opening and on which a lens holder is present with the magnifying lens, and on which a first cylindrical bush is arranged which is connected to a second cylindrical bush in which the polarization-changing element is present, the mirror being fitted to the end of said second cylindrical bush. The lens in such a construction can be readily aligned with respect to the amplifier, while on the other hand the axial position of the mirror can be readily adapted in a final stage of the manufacture of the device. The lens holder is preferably so constructed that the magnifying lens can be aligned with respect to the amplifier both in radial and in axial direction. Preferably, the optoelectronic module is of symmetrical design, the end of the second cylindrical bush being provided with a holder for an optical transmission fiber. The latter can be easily coupled to, for example, an optical circulator.

The amplifier contained in the device is preferably as insensitive to polarization as possible of itself already. An amplifier having a low polarization sensitivity (TE-TM gain difference approximately 3 dB) may be obtained, for example, in that the active region of the amplifier is built up from very thin semiconductor layers which alternately have a compression and tension stress. A device according to the invention provided with such an amplifier has a particularly low polarization sensitivity, the difference between TE and TM amplification being, for example, below 0.5 dB. Such a device according to the invention is particularly suitable for the applications mentioned above and has a high, well-reproducible efficiency. In addition, the device can be manufactured in a comparatively simple and inexpensive manner.

Preferably, a filter which blocks out spontaneous emission of the amplifier as much as possible is present between the magnifying lens and the polarization-changing element. In another major modification, the mirror is semi-transparent, and a radiation-sensitive diode is present behind the mirror, serving as a monitor diode for the amplifier. Since no particularly high requirements need be imposed on the mirror in a device according to the invention, the mirror may also comprise a thin metal layer which is provided on the radiation-sensitive diode. This metal layer may at the same time serve for one of the electrical connections of the radiation-sensitive diode, if so desired.

BRIEF DESCRIPTION OF THE DRAWINGS

The Figures are diagrammatic and not drawn true to scale. Corresponding parts have been given the same reference numerals in general in the various Figures.

DETAILED DESCRIPTION

Figure 1:
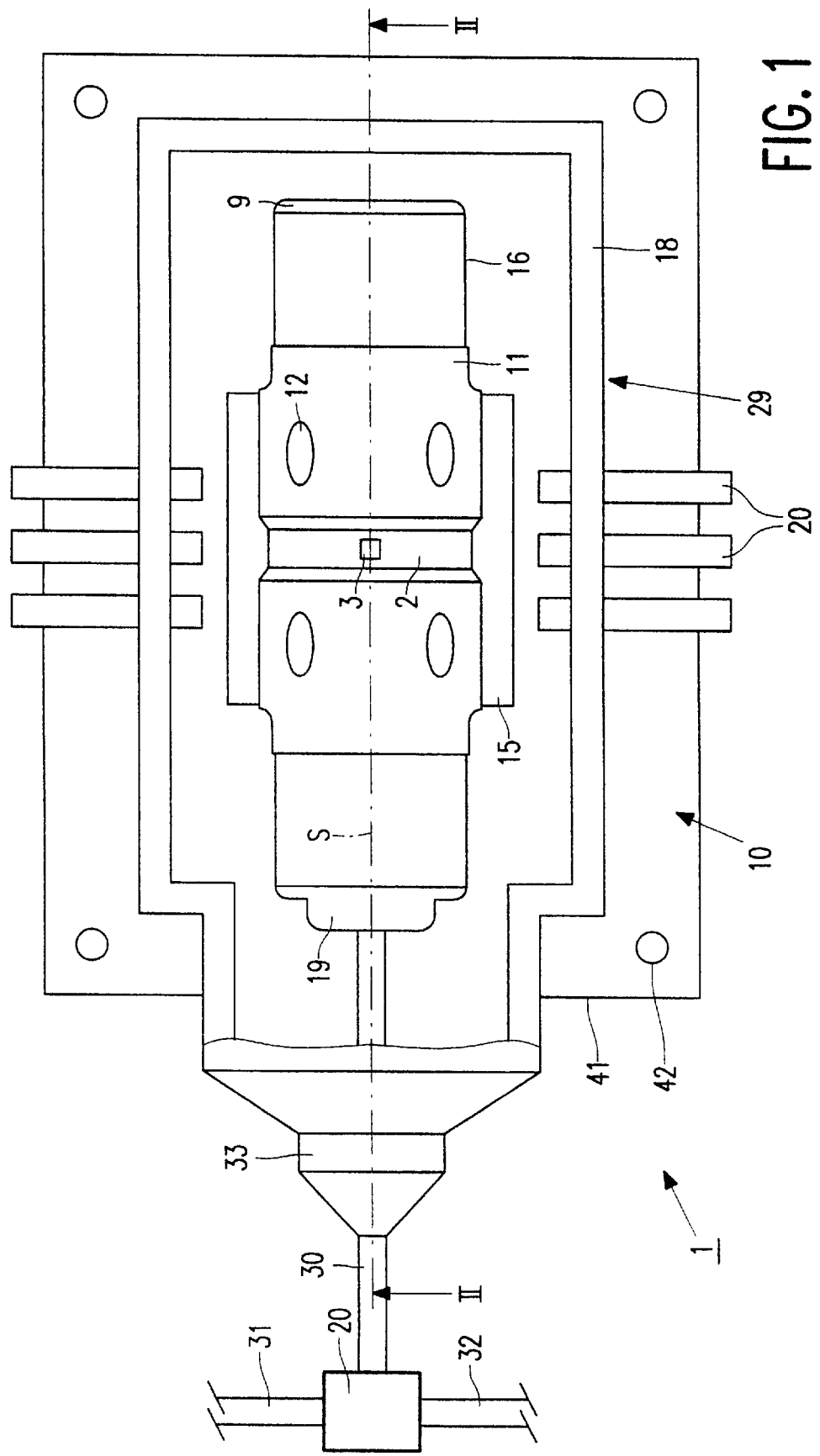
FIG. 1 diagrammatically shows a plan view, partly broken away, of an optoelectronic device according to the invention.
Figure 2:
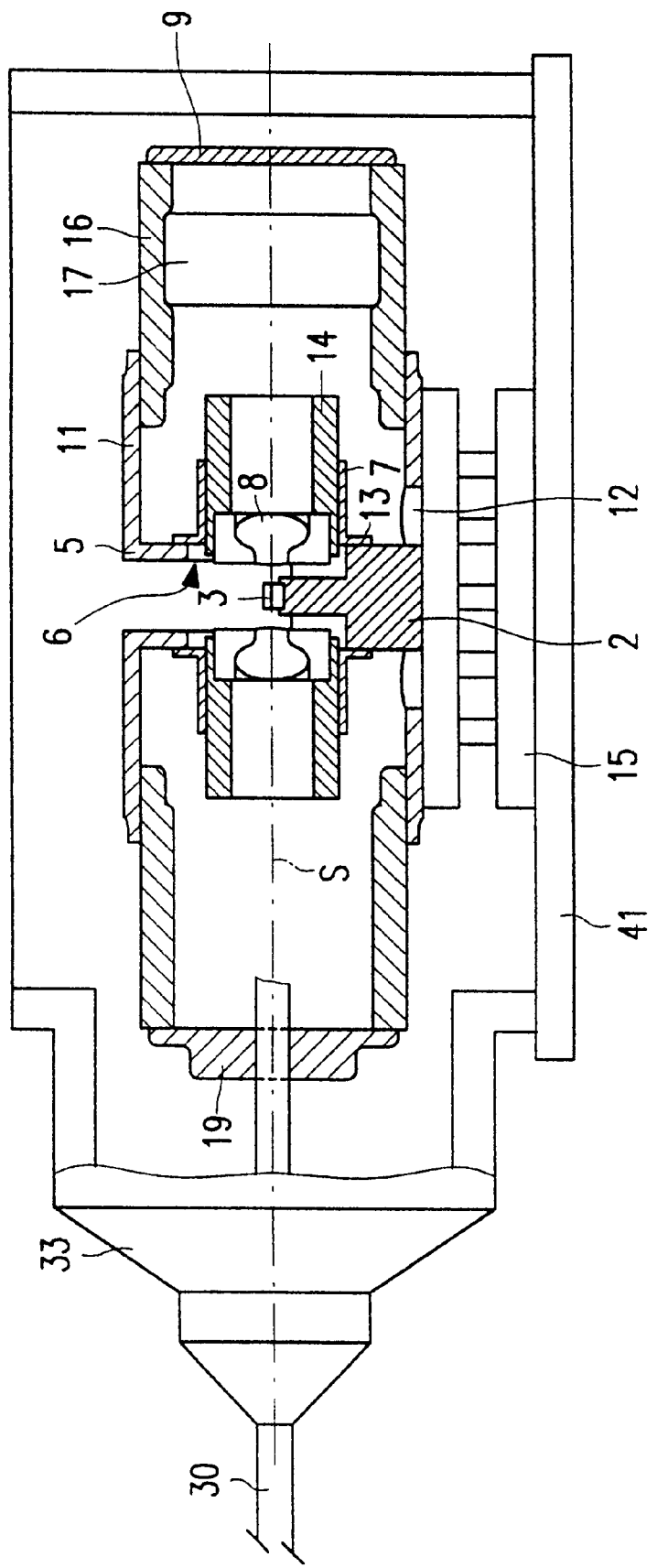
FIG. 2 is a diagrammatic cross-section through a portion of the device of FIG. 1 taken on the line II—II.

FIG. 1 is a diagrammatic plan view, partly broken away, of an optoelectronic device 1 according to the invention. FIG. 2 is a diagrammatic cross-section through a portion 10 of the device 1 of FIG. 1 taken on the line II—II. The device comprises a module 10 in which a semiconductor diode laser amplifier 3 is present on a holder 2, said amplifier having a strip-shaped active region whose longitudinal direction corresponds to the direction of the radiation S and which is bounded in longitudinal direction by two end faces where the radiation S can enter or leave the amplifier 3. At one side of the amplifier 3 are found in that order: a lens 8, a polarization-changing element 17, a Faraday rotator 17 in this case, and a mirror 9. Radiation S passing through the device 1 is amplified twice: once when passing through the amplifier 3 before reaching the polarization-changing element 17, and once after reflection by the mirror 8 and after passing through the polarization-changing element 17 again, during a second passage through the amplifier 3, but now in the opposite direction. The polarization of the radiation S to be amplified thus differs from that at the first passage through the amplifier 3 by approximately 90° during the second passage through the amplifier 3. The final gain of the radiation S to be amplified is not or at least substantially not dependent on the polarization of the radiation S to be amplified in this manner. This is an important advantage.

According to the invention, the lens 8 comprises a magnifying lens 8, and the mirror 9 is in the image plane of the magnifying lens 8. The use of a magnifying lens 8 instead of a collimating lens 8 renders the alignment between the amplifier 3 and the lens 8 less critical: the alignment tolerance in radial direction is now a function of the object field of the lens and is approximately ±30 μm, whereas with the use of a collimating lens this tolerance corresponds to the focus of the lens and is ±1 μm. This renders the alignment of the device 1 according to the invention much more accurate and easy. The efficiency of the device 1 according to the invention is not only much higher, but also much more stable and reproducible, which are important advantages. This is also connected with the fact that the mirror 9 is in the image plane of the magnifying lens 8. The angle which should be enclosed by the mirror 9 and the radiation path is not critical, it merely has to be approximately 90°. This angle is also allowed to differ from one device 1 to another device 1. It is also easy now to correct any inaccuracy in the alignment between the amplifier 3 and the magnifying lens 8 in that the axial position of the mirror 9 is adapted. This may be done in a particularly easy manner in that the mirror 9 is fastened to a cylindrical bush which is capable of sliding in another cylindrical bush. An additional advantage of the device according to the invention, finally, is that the polarization-changing element 17 need not be given an angle with respect to the optical axis. The device 1 and its manufacture are further simplified thereby.

In the present example, the magnify lens 8 comprises an aspherical magnifying lens 8, and the amplifier 3 is present in the object plane of this lens. Such a lens 8 allows of comparatively small object plane and image plane distances, so that the device 1 in the present example can still be particularly compact and thus suitable for use at high transmission speeds of, for example, 10 Gbits. The object distance and image distance in this example are 1.2 and 7 mm, respectively. The polarization-changing element 17 in this example comprises a 2 mm long Faraday rotator 17 which is built up from a YIG (=Yttrium Iron Garnet) plate surrounded by a magnet. The device 1 in this example comprises means 20, here comprising a circulator 20, by means of which the radiation to be amplified and present in a glass fiber 30 is separated from amplified radiation issuing from the amplifier 3 and guided towards another glass fiber 32.

The device 1 in this example comprises a module 10 with a holder 2 for the amplifier 3, which holder in this example is provided on either side with a plate 5 which is fitted with an opening 6 and on which a lens holder 7 is present with a magnifying lens 8. The plate 5 is provided with a first cylindrical bush 11 which is connected to a second cylindrical bush 16. At one side of the amplifier 3, the second cylindrical bush 16 contains the Faraday rotator 17, and the end of this bush is provided with the mirror 9 which here comprises a silicon plate 9 on which a thin gold layer was vapor-deposited. At the other side of the amplifier, the end of the second cylindrical bush 16 is provided with a holder 19 which accommodates the glass fiber 30 through which the radiation S travels before and after amplification in the amplifier 3. This substantially symmetrical construction of the module 10 renders the manufacture thereof comparatively simple. The module 10 can also be compact. The alignment of the various components can take place in an easy, reproducible, and accurate manner. The polarization sensitivity of the device 1 according to the invention is further reduced in that it is fitted with an amplifier 3 which itself already has a very low polarization sensitivity. The strip-shaped active region of the amplifier in this example comprises very thin layers with alternately a tension and a compression stress for this purpose.

The lens holder 7 is cylindrical, comprising a flange 13 and a cylindrical bush 14. The magnifying lens 8 can be readily aligned with respect to the amplifier 3 in the x, y, and z directions as a result of this. Openings 12 in the cylindrical bush 11 provide access to the lens holder 7, for example for fastening the latter to the plate 5. A Peltier cooling element 15 provides the temperature stabilization of the amplifier 3. The module 10 here further comprises a box 18 of the BF (=ButterFly) type. This means that two side faces 29 are each provided with a row of electrically insulated electrical lead-through conductors 20. The electrical connections between the conductors 20 and the amplifier 3, and any other optoelectronic components, are not shown in the Figures. The box 18 is particularly compact and has a bottom plate 41 which is provided with openings 42. The glass fiber 30 has a packing, which at the same time serves as a strain relief grommet, where it leaves the box 18. The box 18 is made of Kovar or Fernico, i.e. alloys containing iron, cobalt, and nickel, as is a lid thereof which is not shown in the Figures. The holder 2 is made of stainless steel.

An important advantage of the device 1 is that no high requirements need be imposed on the mirror 9 used therein, for example as regards the planeness of this mirror. This renders it possible to form the mirror 9 from a thin metal layer applied, for example, on a photodiode. Given a suitable thickness of the metal layer, part of the radiation incident on the mirror 9 will pass through the mirror 9 and reach the photodiode. This diode can then serve as a monitor diode for the amplifier 3. The construction of the device described in this example is particularly suitable for accommodating such a photodiode in the second cylindrical bush 16. Such a photodiode, however, is not shown in the drawing accompanying the present example.

The device 1 according to this example is manufactured as follows (see FIGS. 1 and 2). The amplifier 3, possibly together with other (opto)electronic components, is fastened on the holder 2. Then the lens 8 is aligned in the lens holder 7 with respect to the amplifier 3. This is done in the x, y directions by shifting of the lens holder 7 over the plate 5, and for the z direction by shifting of the bush 14 in the lens holder 7. Then the bush 14 is fastened to the lens holder 7 and the flange 13 of the lens holder 7 is fastened to the plate 5 by means of laser welds made through the openings 12. The second cylindrical bush 16 provided with the Faraday rotator 17 and the mirror 9 is subsequently aligned and fastened to the first cylindrical bush 11. The same is done at the other side of the amplifier 3 with the second cylindrical bush 16 provided with the holder 19 for the glass fiber. The holder 19 with the glass fiber 10 is aligned with respect to the lens 8 and fastened to the first holder 2, the second cylindrical bush 16 being passed into the first cylindrical bush 11 and the holder being moved against the second cylindrical bush 16 during this. The sub-module thus obtained is subsequently fastened on the Peltier cooling element 15 in the box 18, whereupon the electrical connections (not shown) between the amplifier 3 and any further (opto)electronic components which may be present on the one hand and the electrical conductors 20 on the other hand are provided, for example wire connections. After the packing 33 has been provided and a lid has been fastened on the upper side of the box 18, the device according to the invention is ready for use and may be connected, for example, to the circulator 20.

The invention is not limited to the embodiment described since many modifications and variations are possible to those skilled in the art within the scope of the invention. Thus materials or dimensions other than those mentioned in the example may be used. The device may advantageously comprise other optoelectronic components in addition to the photodiode mentioned above, or also passive electronic components such as resistors and capacitors.

What is claimed is:

1. An optoelectronic device comprising a semiconductor diode laser amplifier with a strip-shaped active region which is bounded in longitudinal direction by two end faces where radiation can enter or leave the amplifier, while at one side of the amplifier are present in the following order: a lens, a polarization-changing element, and a mirror, such that radiation passing through said element, reflected by the mirror, and passing through the element once more has a polarization which has been rotated through 90°, characterized in that the lens comprises a magnifying lens, and the mirror is substantially in the image plane of the magnifying lens.

2. An optoelectronic device as claimed in claim 1, characterized in that the magnifying lens comprises an aspherical magnifying lens with a magnification factor between 1 and 10×, and in that an end face of the amplifier lies in the object plane of said magnifying lens.

3. An optoelectronic device as claimed in claim 1, characterized in that the object plane distance of the magnifying lens lies between 0.3 and 3 mm, and the image distance lies between 3 and 20 mm.

4. An optoelectronic device as claimed in claim 1, characterized in that means are present at the other side of the amplifier for separating incoming and outgoing radiation from one another.

5. An optoelectronic device as claimed in claim 1, characterized in that the optoelectronic device comprises an optoelectronic module comprising a holder for the amplifier which is provided at one side of the amplifier with a plate which has an opening and on which a lens holder is present with a magnifying lens, and on which a first cylindrical bush is arranged which is connected to a second cylindrical bush in which the polarization-changing element is present, the mirror being fitted to the end of said second cylindrical bush.

6. An optoelectronic device as claimed in claim 5, characterized in that the holder for the amplifier is provided at the other side of the amplifier with a plate which is provided with an opening and on which a lens holder is present with a magnifying lens, and on which a first cylindrical bush is arranged which is connected to a second cylindrical bush, which second cylindrical bush is connected to a holder for an optical transmission fiber at this side of the amplifier.

7. An optoelectronic device as claimed in claim 1, characterized in that the amplifier comprises means for reducing the polarization sensitivity of the amplifier.

8. An optoelectronic device as claimed in claim 1, characterized in that a filter transmitting the radiation to be amplified and the amplified radiation and blocking the spontaneous emission of the amplifier is present between the magnifying lens and the polarization-changing element.

9. An optoelectronic device as claimed in claim 1, characterized in that the mirror is semi-transparent, and a radiation-sensitive diode is present behind the mirror.

10. An optoelectronic device as claimed in claim 9, characterized in that the mirror comprises a thin metal layer which is provided on the radiation-sensitive diode.

* * * * *